US009830411B2

(12) United States Patent
Gnecco et al.

(10) Patent No.: US 9,830,411 B2
(45) Date of Patent: Nov. 28, 2017

(54) SYSTEM AND METHOD FOR LOCATING IMPACTS ON AN EXTERNAL SURFACE

(71) Applicant: Airbus Operations SAS, Toulous (FR)

(72) Inventors: Ronie Gnecco, Montaigut sur Save (FR); David Martinez, Montaigut sur Save (FR); Denis Gattone, Touget (FR); Jean-Louis Guittard, Toulouse (FR)

(73) Assignee: Airbus Operations (SAS), Toulouse (FR)

( * ) Notice: Subject to any disclaimer, the term of this patent is extended or adjusted under 35 U.S.C. 154(b) by 0 days.

(21) Appl. No.: 15/193,497

(22) Filed: Jun. 27, 2016

(65) Prior Publication Data

US 2016/0378895 A1    Dec. 29, 2016

(30) Foreign Application Priority Data

Jun. 29, 2015    (FR) ...................... 15 56048

(51) Int. Cl.
| | |
|---|---|
| *B64F 5/00* | (2017.01) |
| *B64F 5/60* | (2017.01) |
| *B64C 1/00* | (2006.01) |
| *G06F 17/50* | (2006.01) |

(Continued)

(52) U.S. Cl.
CPC ............ *G06F 17/5009* (2013.01); *B64F 5/60* (2017.01); *G01S 13/08* (2013.01); *G01S 15/08* (2013.01);

(Continued)

(58) Field of Classification Search
CPC ................ B64C 1/00; B64F 5/00; B64F 5/60
See application file for complete search history.

(56) References Cited

U.S. PATENT DOCUMENTS

| | | | | |
|---|---|---|---|---|
| 4,947,351 A | * | 8/1990 | Moran ............... | G01N 29/0609 702/39 |
| 5,760,904 A | * | 6/1998 | Lorraine ................ | G01B 11/16 356/513 |

(Continued)

FOREIGN PATENT DOCUMENTS

WO    2012044297    4/2012

OTHER PUBLICATIONS

French Search Report, dated Mar. 11, 2016, priority document.
"Phtogrammetric Archaeological Survey with UAV", May 28, 2014.

*Primary Examiner* — Yonel Beulieu
(74) *Attorney, Agent, or Firm* — Greer, Burns & Crain, Ltd.

(57) ABSTRACT

A method for locating external surface impacts on a body. The steps are: modeling the body in a control unit first database to obtain a virtual body model in a virtual system of reference axes; modeling, in a second database, a plurality of clouds of points in the virtual system, each cloud defining an inspection zone representing an external surface portion; selecting an inspection zone; transferring the coordinates of each point of the first and second databases to a geographic system of reference axes; determining geographic coordinates of an initial position of a range finder equipped flying drone communicating with the processing unit; calculating a drone flight plan to scan the selected inspection zone; creating a 3D meshing of the scanned inspection zone; detecting the impacts by comparing the 3D meshing and the virtual aircraft model and calculating the coordinates of each impact in the geographic and virtual systems.

11 Claims, 4 Drawing Sheets

(51) Int. Cl.
*G06T 7/00* (2017.01)
*G01S 13/08* (2006.01)
*G01S 15/08* (2006.01)
*G01S 17/08* (2006.01)
*G01S 19/42* (2010.01)
*G01S 19/53* (2010.01)
*G05D 1/00* (2006.01)
*G05D 1/04* (2006.01)
*H04N 5/225* (2006.01)

(52) U.S. Cl.
CPC .............. *G01S 17/08* (2013.01); *G01S 19/42* (2013.01); *G01S 19/53* (2013.01); *G05D 1/0011* (2013.01); *G05D 1/042* (2013.01); *G06T 7/0004* (2013.01); *H04N 5/225* (2013.01); *B64C 2201/027* (2013.01); *B64C 2201/127* (2013.01); *G06T 2207/30156* (2013.01)

(56) References Cited

U.S. PATENT DOCUMENTS

| | | | |
|---|---|---|---|
| 6,014,024 A * | 1/2000 | Hockey | G01N 27/82 324/225 |
| 8,756,085 B1 | 6/2014 | Plummer et al. | |
| 9,500,546 B2 * | 11/2016 | Read | G01N 29/11 |
| 2006/0186260 A1 * | 8/2006 | Magnuson | B64F 5/60 244/1 R |
| 2013/0317667 A1 | 11/2013 | Kruglick | |
| 2014/0046589 A1 | 2/2014 | Metzler et al. | |
| 2014/0168420 A1 | 6/2014 | Naderhirn et al. | |
| 2014/0172357 A1 | 6/2014 | Heinonen | |
| 2014/0202248 A1 * | 7/2014 | Read | G01N 29/11 73/583 |
| 2014/0267627 A1 | 9/2014 | Freeman et al. | |
| 2016/0299506 A1 * | 10/2016 | Bruggeman | B64D 31/06 |

* cited by examiner

SYSTEM AND METHOD FOR LOCATING IMPACTS ON AN EXTERNAL SURFACE

CROSS-REFERENCES TO RELATED APPLICATIONS

This application claims the benefit of the French patent application No. 1556048 filed on Jun. 29, 2015, the entire disclosures of which are incorporated herein by way of reference.

BACKGROUND OF THE INVENTION

The present invention relates to a system and a method for determining the coordinates of impacts happening on the external surface of a body/vehicle, such as, for example, indentations of the external surface (or skin) of an aircraft following the fall of an object or a collision with a bird.

The location of impacts on the external surface (or skin) of an aircraft is currently carried out using a tape measure for measuring the distances of the impact with respect to references which are the structural elements such as numbered frames, stringers or ribs forming the internal structure of the fuselage or of the wings.

Such an operation mobilizes a plurality of technicians and takes a long time to implement, notably when it is necessary to erect scaffolding in order to reach a high part of the aircraft where the impact is situated.

SUMMARY OF THE INVENTION

The purpose of the invention is to locate impacts on the external surface of a fuselage more quickly and more simply. For this purpose, the invention relates to a method for locating impacts on an external surface of a body comprising the following steps:

A) modeling the body in a first database of a control unit in order to obtain a virtual model of the body in a virtual system of reference axes;

B) modeling, in a second database of the control unit, of a plurality of clouds of points in the virtual system of reference axes, each cloud of points, called an inspection zone, representing a portion of the external surface of the body;

C) selection of an inspection zone via a man-machine interface of the control unit;

D) transfer, by a central processing unit of the control unit, of the coordinates of each point of the first and second databases from the virtual system of reference axes to a geographic system of reference axes;

E) determination of the coordinates in the geographic system of reference axes of the initial position of a flying drone in communication with the central processing unit, the drone being equipped with a range finder;

F) calculation, by the central processing unit, of a flight plan of the drone such that it scans, via the range finder, the selected inspection zone;

G) creation, by the central processing unit, of a 3D meshing of the selected inspection zone scanned by the range finder;

H) detection by the central processing unit of the impacts, by a comparison between the 3D meshing and the virtual model of the aircraft and calculation, by the central processing unit, of the coordinates of each impact in the geographic system of reference axes and the virtual system of reference axes.

The invention also relates to the system for implementing this method.

The invention thus makes it possible, via the use of a drone and the choice of an inspection zone of the aircraft by the drone, to quickly detect and locate impacts on the external surface 110 of the aircraft A.

BRIEF DESCRIPTION OF THE DRAWINGS

The features of the invention mentioned above, as well as others, will appear more clearly on reading the following description of examples of embodiment, the description being given with reference to the appended drawings, in which.

DETAILED DESCRIPTION OF THE PREFERRED EMBODIMENTS

Figure 1:
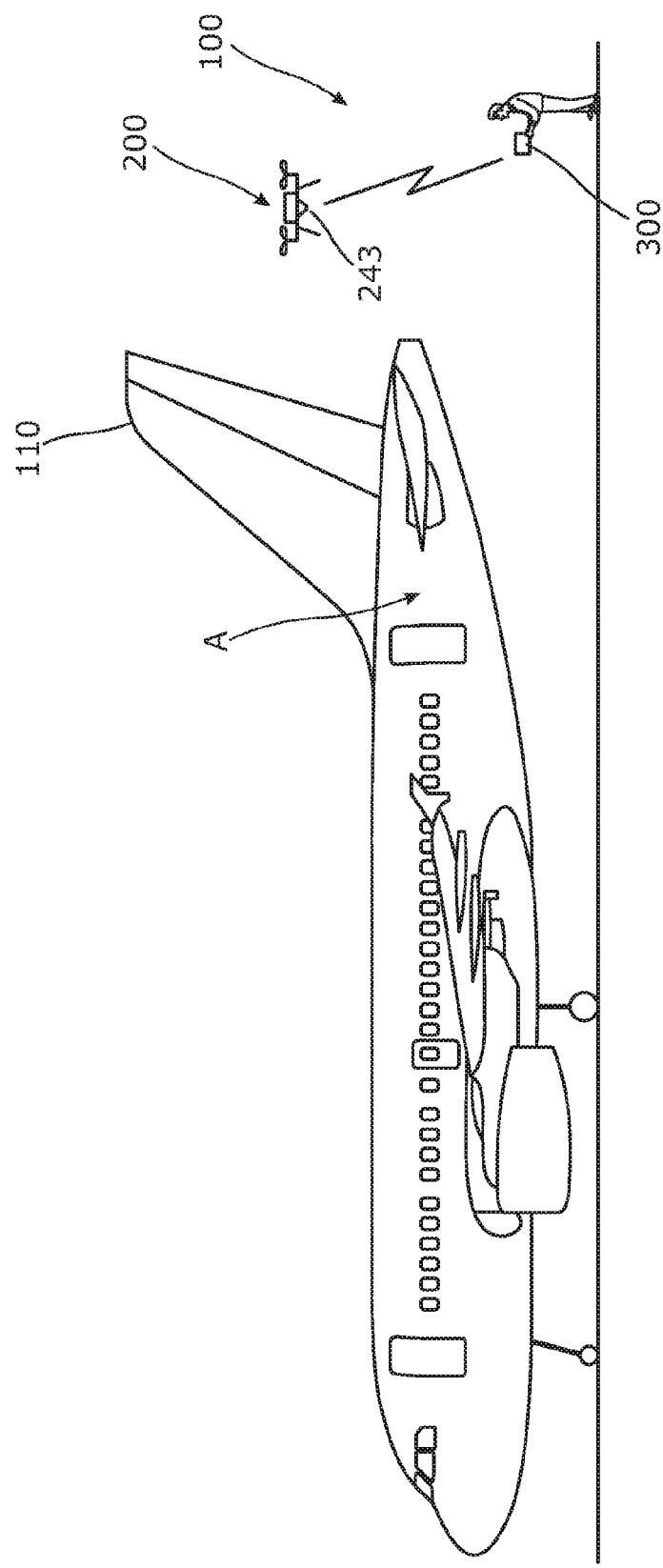
FIG. 1 is a diagram of the system for locating impacts according to one embodiment of the invention for detecting and locating impacts on the external surface of an aircraft, the system comprising a flying drone in communication with a control unit on the ground.
Figure 2:
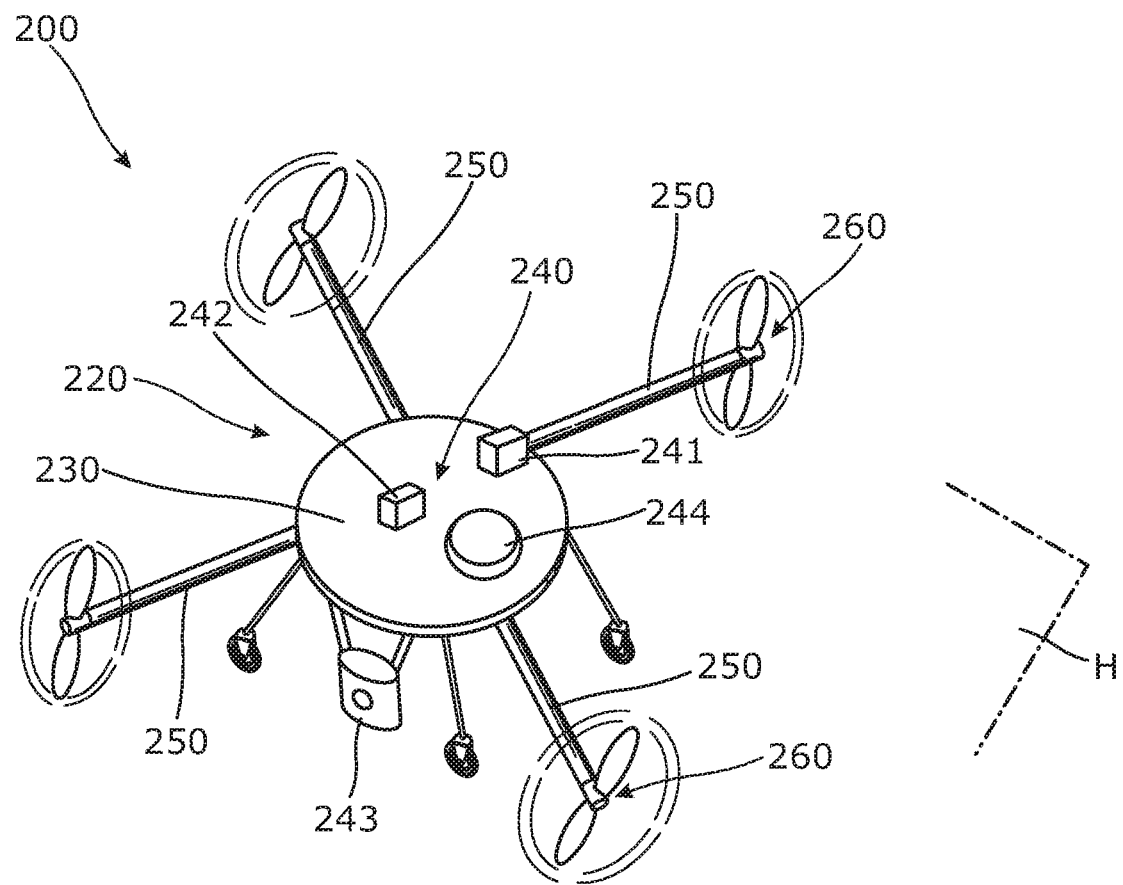
FIG. 2 is a diagrammatic view of the flying drone shown in FIG. 1.
Figure 3:
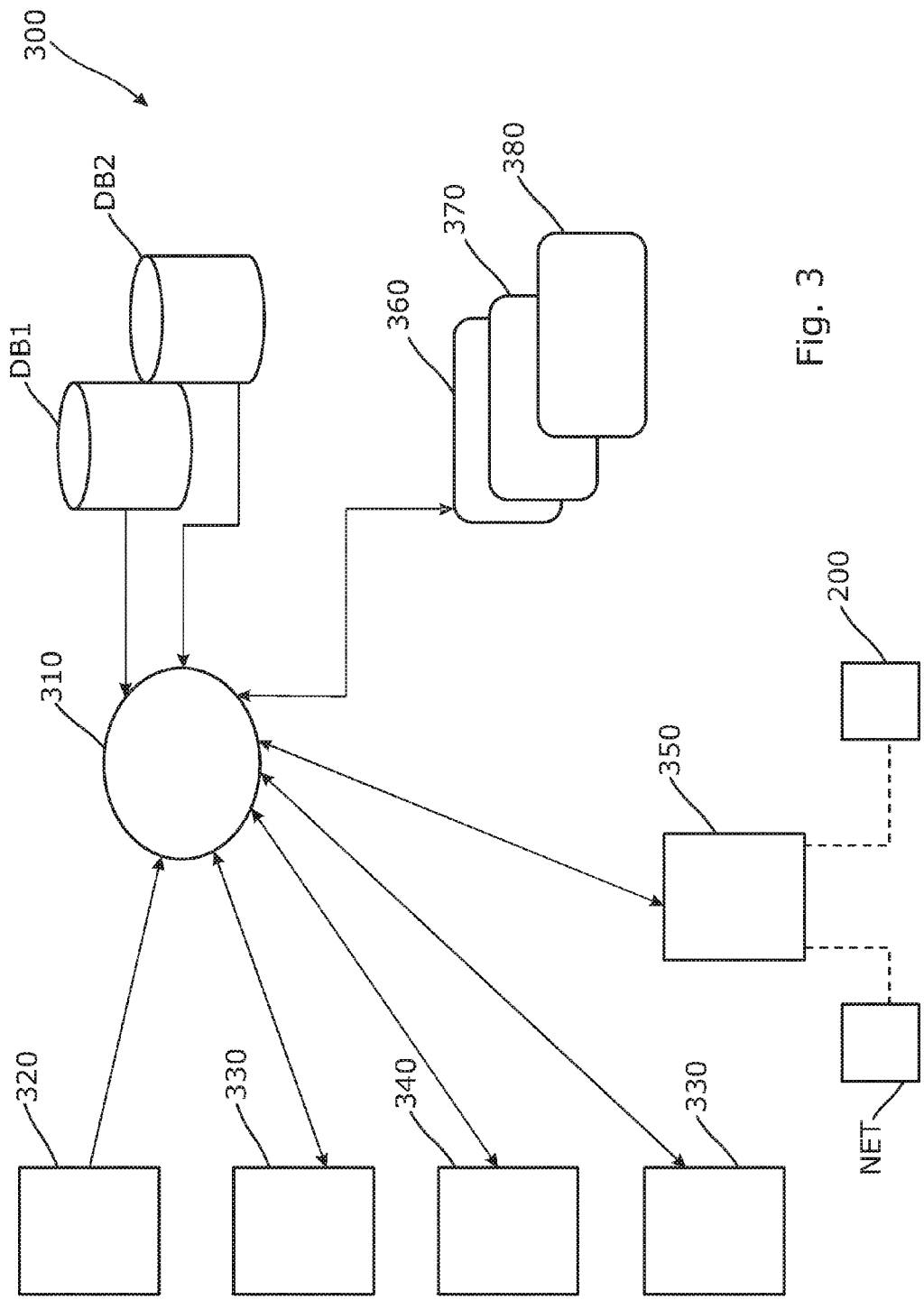
FIG. 3 is a diagrammatic view of the control unit shown in FIG. 1.

According to the invention and with reference to FIGS. 1 to 3, the system for locating impacts 100 on the external surface 110 of an aircraft A comprises a flying drone 200 provided with at least one range finder 243 for scanning the surface 110, and a control unit 300 placed on the ground simultaneously providing the functions of controlling the drone 200 and of processing the data provided by the latter.

The flying drone 200, more particularly shown in FIG. 2, is, for example, a drone of the quadcopter type comprising a chassis 220 having a central part 230. The latter, of circular shape, carries an electronics load 240 and four extensions 250 extending out of the central part 230. Each extension carries at its free end a propulsive assembly 260 composed of a motor driving a propeller.

The electronics load 240 is composed of a controller 241 connected to various sensors 242, to a range finder 243 configured for scanning the external surface 110 of the aircraft, as well as to signal transmitter/receiver means 244 for communication with the control unit on the ground.

The range finder 243 equipping the drone is, for example, an optical, acoustic or radar range finder. Preferably, it is an optical range finder of the LIDAR (Laser Detection And Ranging: laser range finding) type carried by the chassis 220, for example underneath the latter. In a known way, the LIDAR comprises a pulsed laser transmitter, a receiver comprising a light collector, a photo-detector converting the collected light into an electrical signal, and an electronic system for processing the signal. The LIDAR calculates the distance separating the drone 200 from the external surface 110 of the aircraft from the time difference between the transmission, by the laser transmitter, of a pulse and the reception, by the photo-detector, of the detected light echo reflected by the external surface 110. The measured distances, called range finding data, make it possible to determine the coordinates of points on the scanned surface and to produce a 3D meshing of the latter.

The sensors 242 of the drone comprise at least one position sensor and one orientation sensor. The orientation sensor determines the inclination of the attitude of the drone with respect to a horizontal plane H (the ground), and is, for example, of the gyroscopic sensor or inclinometer type. The position sensor makes it possible to give the position of a point of the drone in the form of coordinates in a geographic system of reference axes (latitude, longitude, altitude) and is a receiver of satellite signals, for example of GPS (Global Positioning System) signals. In the continuation of this description it will be considered that all of the satellite signals used are GPS signals.

It should be noted that the position of the range finder 243 with respect to the satellite signals receiver is known and recorded in a memory of the controller 241. This position will be used in the production of a 3D meshing of the scanned surface as will be described in the continuation of the description.

The controller 241 is configured to serve as an interface between all of the components of the drone 200 and is configured for keeping the flight of the drone stable whilst obeying flight instructions (flight plan) supplied to the drone by the control unit 300 via the signal transmitter/receiver means 244.

The signal transmitter/receiver means 244 are, for example, formed by a radio transceiver, making it possible to transfer data from the drone 200 to the control unit 300 and to receive flight instructions coming from the latter. The data from the drone notably comprise the data from the sensors 242 of the drone and the range finding data supplied by the range finder 243.

It will be noted that the drone 200 is furthermore equipped with protection devices of the proximity sensor type (not shown) mounted in the chassis 220 of the drone in order not to come into collision with the aircraft to be inspected. Such a device, connected to the controller 241, is, for example, an optical proximity sensor operating in analog mode where the amplitude of the signal that it provides to the controller 241 is a function of the relative position of objects close to the drone 200 and situated in the detection field of the sensor. When an object, such as, for example, the external surface 110 of the aircraft, is situated at less than a predetermined distance from the drone 200, the signal from the sensor exceeds a threshold value. In this case, the controller 241 pilots the flight of the drone in such a way as to distance the latter from the external surface 110 until the amplitude of the signal is below the threshold value. The predetermined distance is preferably of the order of 3 m, or of 1 m.

With reference to FIG. 3, the ground control unit 300 comprises different elements interfaced with each other including:
- a central processing unit 310 managing the operation of the control unit 300 and the control of the drone 200. The central processing unit uses various data processing programs and comprises memories in which two databases DB1 and DB2 are recorded;
- a man-machine interface 320 via which an operator can interact with the control unit 300;
- a display device 330;
- a camera 340, for example of the CMOS (Complementary Metal Oxide Semiconductor)) or CCD (Charge Coupled Device) type, making it possible to take images that can be displayed on the display device 330;
- a communication module 350 for transmitting and receiving data;
- a module for determining the position of the aircraft 360 configured for determining the position and orientation of the inspected aircraft A with respect to the control unit 300;
- a control module 370 receiving data from the sensors of the drone and which is configured for calculating a flight plan of the drone 200 towards the external surface 110 of the aircraft to be inspected and piloting the flight of the drone according to that plan;
- an impact detection module 380 configured for detecting and locating an impact on the external surface 110 of the aircraft to be inspected as a function of the range finder data provided by the drone 200 and of the position of the latter; and
- satellite positioning means 390, for example receivers of GPS satellite signals, for determining the coordinates in the geographic system of reference axes (latitude, longitude, altitude) of the ground control unit.

The central processing unit 310 uses an operating system OS (Operating System) which, in a known way, allows an operator of the control unit to interact, via the man-machine interface 320, with the latter, for example by enlarging/reducing, pointing at certain elements displayed on the display device 330, etc. The control unit 300 is preferably a touch tablet of the type of those available commercially where the touch screen of the tablet combines the functions of the display device 330 and of the man-machine interface 320.

The communication module 350 is, for example, a transceiver operating with radio signals. This module makes it possible to receive data from the drone 200 and to transmit data to the latter. Moreover, the communication module 350 allows the connection and the exchange of data with an external network NET which is, for example, the network of an airline company or of an aeronautical constructor. The external network NET comprises a shared database that can be remotely interrogated where each identifying number IDN (registration number, serial number, tail number) of an aircraft is associated with its model (Airbus A350, Airbus A380, Airbus A320, or models of other constructors) and the coordinates in the geographic system of reference axes of a satellite signals receiver installed in the fuselage of the aircraft.

Each one of the modules for determining the position of the aircraft 360, for controlling the flight 370 of the drone and for impact detection 380 is a program used by the central processing unit 310 and is recorded in a memory of the latter. Each program receives at its input data coming from the different elements of the control unit 300. The functioning of each of these programs will be described later in the description in relation to a method for locating an impact on an aircraft by means of the system 100 according to the invention.

The module for determining the position of the aircraft 360 and the impact detection module 380 call upon the first database DB1 containing data relative to different aircraft models upon which the system 100 according to the invention can be used. As for the flight control module 370, this calls upon the second database DB2 containing, for each aircraft model, data relative to specific inspection zones of the external surface 110 of the aircraft.

The first database DB1 comprises data obtained by assisted three-dimensional modeling of the whole of various modeled aircraft models. This database therefore comprises, for each modeled aircraft model, a virtual model V (or DMU: Digital Mock-Up) which comprises the modeling of all of the elements of the aircraft A, such as, for example, the external surface 110 (skin) of the aircraft, the structural elements forming the internal structure of the aircraft (frames, stringers, floors, ribs, etc.), the distinctive elements of the external surface of the aircraft (for example: the windows, the doors, the probes, the antennas, engines, hatches, flaps, etc.) or the satellite signals receiver equipping the aircraft. An operator accessing the first database DB1 via the operating system is able to display a virtual model V of the aircraft on the display device 330 and to determine the coordinates of each point of a modeled element of the aircraft in a virtual system of reference axes O,X,Y,Z.

The second database DB2 comprises the coordinates, in the virtual system of reference axes O,X,Y,Z, of a plurality of clouds of points where each of the clouds represents a portion of the external surface 110 of each aircraft modeled in the first database. As will be described below, each cloud of points forms a potential scan zone for the range finder 243 of the flying drone. In the continuation of the description, a cloud of points will be called an inspection zone. By way of example, an inspection zone is the upper part of the left wing of the aircraft, the upper part of the fuselage at the level of the nose of the aircraft, the dome (radome) of the aircraft, left hand section of the tail fin, etc.

Figure 4:
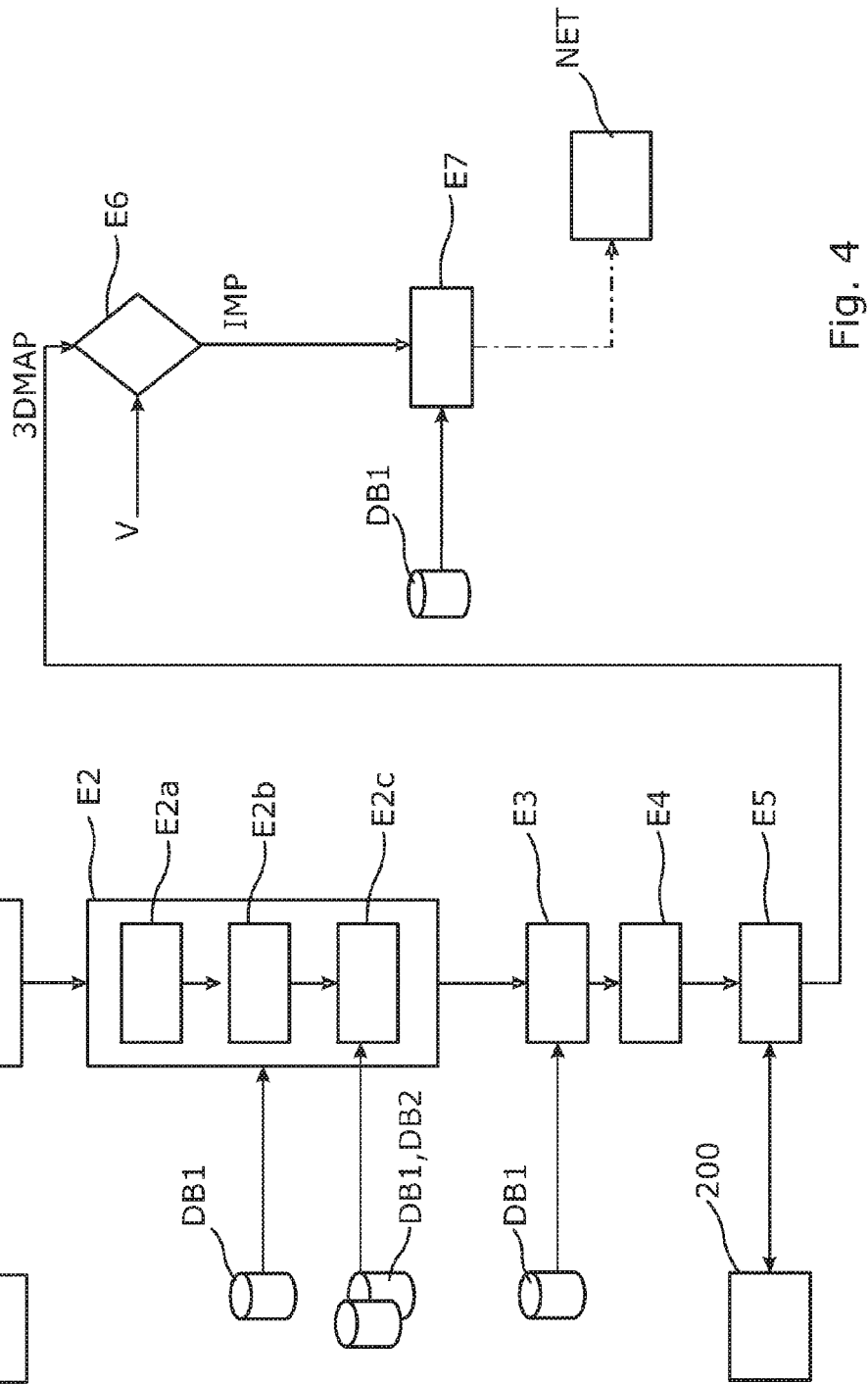
FIG. 4 is a diagram illustrating a use of the system according to the invention for locating an impact and determining the coordinates of the impact on the external surface of an aircraft using a virtual model of the aircraft and a flying drone.

The location of an impact, by an operator of an entity responsible for the inspection of the aircraft A (airline company, constructor), on the external surface 110 of an aircraft by means of the system 100 according to the invention will now be described with reference to FIG. 4.

In a first step E1, the operator wishing to inspect the fuselage of an aircraft notes the identifier of aircraft IDN and, by means of the man-machine interface 320, sends this identifier to the external network NET via the communication module 350. In response, the network NET supplies the central processing unit 310 with the aircraft model bearing this identifier IDN as well as the coordinates in the geographic system of reference axes of a point corresponding to the position of the satellite signals receiver equipping the aircraft A.

In a second step E2, the central processing unit 310 determines the position and the orientation of the aircraft A in order to convert the coordinates of the virtual model V stored in the first database DB1 and points in the second DB2 from the virtual system of reference axes O,X,Y,Z into the geographic system of reference axes so that the central processing unit 310 can subsequently calculate a flight plan of the drone 200 towards an inspection zone.

For this purpose, in a first sub-step E2a of the second step E2, the central processing unit 310 executes the module for determining the position of the aircraft 360 in order to determine the distance between the satellite signals receiver of the aircraft A and the satellite positioning means 390 of the central processing unit; each one of the receiver of the aircraft and the satellite positioning means of the central processing unit being materialized in the form of a point having its coordinates in the system of geographic reference axes.

Then, in a second sub-step E2b, the central processing unit 310 executes the module for determining the position of the aircraft 360 in order to determine the orientation of the aircraft A. In order to do this, via a message displayed on the display device 330, the module for determining the position of the aircraft 360 requests the operator to take, via the camera, an image of the aircraft A upon which two symmetrical elements of the aircraft are present: it can, for example, be a matter of taking a frontal image of the aircraft upon which two engines that are symmetrical with each other with respect to the sagittal plane (passing through its longitudinal axis) of the aircraft can be seen, such as, for example, the pair of engines situated closest to the fuselage. The central processing unit 310 displays the image on the display device 330 and requests the operator to point to, with a first cursor, the center of the fan of the left hand engine and, with a second cursor, to the center of the fan of the symmetrical right hand engine.

Once this operation is completed, the central processing unit 310 calculates the distance on the image between the two cursors and compares it to the distance, entered in the first database DB1, between the two engines in a plane perpendicular to the longitudinal axis of the aircraft. On the basis of these items of information, and notably of the position of the cursors on the image and of the distance calculated in sub-step E2a, the central processing unit calculates the angle between the longitudinal axis of the aircraft and the control unit 300 and thus derives the orientation of the longitudinal axis of the aircraft A.

In a third sub-step E2c, the module for determining the position of the aircraft 360 knowing the position and the orientation of the aircraft transposes, from the virtual system of reference axes O,X,Y,Z into the geographic system of reference axes, the coordinates of the points of the elements modeled in the first and second databases DB1, DB2.

Consequently, after step E2, each point of the virtual model V recorded in the database DB1 is associated with coordinates of the same point of the aircraft A in the geographic system of reference axes.

In the third step E3, the central processing unit executes the flight control module 370 which calls upon the second database DB2 in order to determine the inspection zones available for the aircraft model in question. Via a message displayed on the display device 330, the flight control module 370 requests the operator to choose one of the inspection zones available for the aircraft model in question.

It should be noted that the steps E3 and E2 could be reversed.

In a step E4, once the choice of the inspection zone has been made and the position and orientation of the aircraft A have been determined, the central processing unit 310 records the position of the drone 200 in the geographic system of reference axes and executes the flight control module 370 in order to calculate a flight plan of the drone 200. The position of the drone 200 is provided by the sensors 242 of the drone.

The flight plan is calculated to provide a flight of the drone 200 going from the initial position of the drone (generally on the ground) to the selected inspection zone around which the drone follows a line of points and then from the inspection zone to the its initial position. The flight plan is calculated so that the drone 200 does not come closer than 1 meter, preferably 3 meters, to the aircraft.

In a fifth step E5, the central processing unit 310 executes the flight control module 370 which provides flight commands to the controller 241 of the drone so that the latter follows the points of the flight plan calculated in step E4. During the flight of the drone 200, the sensors 242 of the drone provide information to the control unit 300 and the control module 370 pilots the drone 200 in order to scan the inspection zone via the range finder 243.

Simultaneously, the central processing unit 310 executes the detection and locating module 380 in order to analyze the range finder data received from the drone. The detection module establishes a 3D meshing 3DMAP of the scanned inspection zone where each point of the meshing 3DMAP has its coordinates in the geographic system of reference axes.

In a sixth step E6, at the end of the flight of the drone 210, the central processing unit 310 executes the detection and locating module 380 which compares the 3D meshing 3DMAP with the virtual module V of the aircraft in order to detect impacts IMP. For this purpose, the zones where the differences in depth between the 3D meshing and the external surface of the virtual model V are greater than a predefined value, for example of the order of 1 mm, are considered to be impacts IMP.

For each impact IMP noted, the central processing unit 310 calculates the geographic coordinates of the impact IMP.

In a seventh step E7, the central processing unit 310 transfers the coordinates of each impact in the system of reference axes O,X,Y,Z and marks the impact IMP by means of a pointer on the virtual model V displayed on the display device 330. Moreover, on this virtual model, the central processing unit points to the frame, stringer or rib closest to the impact IMP. Finally, at the request of the operator, the central processing unit 310 requires the recording in a shared database of the network NET of the coordinates, in the system of reference axes O,X,Y,Z, of each impact IMP detected on the aircraft, together with the numbers of the stringers, frames and ribs that are closest to that impact.

The invention allows rapid availability of historical impacts data of an aircraft and quickly provides the position of an impact with respect to the numbers of the stringers, frames and ribs to the entity responsible for the maintenance of the aircraft. An operator, provided with the system 100 according to the invention will, during a subsequent maintenance inspection, be able to access the shared database to consult the historical record on the aircraft.

The invention thus makes it possible, via the use of a drone and the choice of an inspection zone of the aircraft by the drone, to quickly detect and locate impacts IMP on the external surface 110 of the aircraft A.

Moreover, as the inspection zones available for an aircraft model in question are pre-recorded in the database DB2, the system 100 according to the invention demands of the operator only a little knowledge of the structure of the aircraft A and thus allows a large number of operators to carry out this location. The system 100 according to the present invention thus has the advantage of being usable by an operator unfamiliar with the structure of the aircraft in question, such as a member of the ground staff at an airport. Thanks to the invention, the planning of aircraft inspection procedures is not subject to the constraints of availability of a small number of persons.

The invention is applicable, in addition to an aircraft A, to other bodies such as, for example, hulls of boats.

Even though described as being a quadcopter drone, the drone 200 of the system 100 according to the invention could be another type of flying drone, such as, for example, a helicopter drone provided with a single propulsive assembly.

In a variant not shown in the figures, the drone 200 of the system according to the invention advantageously comprises a video camera connected to the controller 241, for example of the CMOS or CCD type, in order to take images of the surface scanned by the range finder.

The video taken by the video camera can be displayed by the operator of the control unit and can be shared on the network NET.

The central processing unit 310 is configured for associating the recording time of the video with the GPS coordinates of the points scanned at the time of taking the video so that an operator displaying the video is able to determine the coordinates of an impact IMP on the scanned inspection zone.

Finally, the drone 200 advantageously comprises as a position sensor, in addition to the satellite signals receiver, an accelerometer making it possible to determine the position of the drone from a latest known position provided by the satellite signals receiver. The advantage is to be able to use the drone 200 in zones where the level of reception of satellite signals is weak since, in this case, during a loss of satellite signal, the accelerometer complements the satellite receiver in order to provide the position of the drone to the controller 241 or to the central processing unit 310.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for locating impacts on an external surface of a body being an aircraft comprising the following steps:
   a) modeling the body in a first database of a control unit to obtain a virtual model of said body in a virtual system of reference axes;
   b) modeling, in a second database of the control unit, of a plurality of clouds of points in the virtual system of reference axes, each cloud of points, called an inspection zone, representing a portion of the external surface of the body;
   c) selecting an inspection zone via a man-machine interface of the control unit;
   d) transferring, by a central processing unit of the control unit, the coordinates of each point of the first and second databases from the virtual system of reference axes to a geographic system of reference axes;
   d') transferring an initial position of a flying drone to the central processing unit;
   e) determining coordinates, in the geographic system of reference axes, of the initial position of the flying drone in communication with the central processing unit, the drone being equipped with a range finder;
   f) calculating, by the central processing unit, a flight plan of the drone such that it scans, via the range finder, the selected inspection zone;
   f') scanning, by the drone, the selected inspection zone with the range finder according to the flight plan,
   g) creating, by the central processing unit, a 3D meshing of the selected inspection zone scanned by the range finder;
   h) detecting by the central processing unit the impacts, by a comparison between the 3D meshing and the virtual model of said aircraft and calculating, by the central processing unit, the coordinates of each impact in the geographic system of reference axes and the virtual system of reference axes.

2. The method as claimed in claim 1, wherein the body comprises an internal structure formed from a plurality of structural elements and the method comprises, following the step h) of detecting impacts and calculating the coordinates of each impact, an additional step i) of determining, on the virtual model, the structural elements closest to each impact.

3. The method as claimed in claim 1, further comprising, after the step h) of detecting the impacts and calculating the coordinates of each impact, an additional step j) of recording, in a shared database, the coordinates of each impact in the virtual system of reference axes.

4. The method as claimed in claim 1, wherein the transfer step d) comprises a step d1) of determining (E2a), by the central processing unit, the position of the body in the geographic system of reference axes.

5. The method as claimed in claim 1, wherein the transfer step d) comprises a step d2) of determining, by the central processing unit, the orientation of the body in the geographic system of reference axes.

6. The method as claimed in claim 4, wherein the step d1) of determining the position of the body comprises:
 d1a) determining the coordinates of the control unit, in the geographic system of reference axes, via satellite positioning means of the control unit;
 d1b) determining, by the operator, an identifier of the body;
 d1c) interrogating, via the man-machine interface, an external network, with the identifier of the body, to receive the coordinates of the body in the geographic system of reference axes.

7. The method as claimed in claim 5, wherein the step d2) of determining of the orientation of the body comprises:
 d2a) taking by the operator, via a camera of the control unit, an image of the body upon which a first and a second element of the body which are symmetrical with respect to a sagittal plane of said body are present;
 d2b) pointing, at the level of a display device of the control unit, via the man-machine interface, to the first element with a first cursor and to the second element with a second cursor;
 d2c) calculating, by the central processing unit, the distance between the first cursor and the second cursor on the image;
 d2d) comparing, by the central processing unit, the calculated distance and the distance between the first and second elements entered in the first database;
 d2e) calculating, by the central processing unit, the angle between the longitudinal axis of the body and the ground control unit.

8. The method for locating impacts as claimed in claim 1, wherein the step h) of detecting impacts and calculating the coordinates of each impact comprises:

h1) the comparison between the 3D meshing and the virtual model of the aircraft so as to determine differences between said meshing and the virtual model of the aircraft;
 h2) comparing each difference with a predetermined difference value.

9. A system for locating impacts on an external surface of a body being an aircraft, wherein the device system comprises:
 a flying drone comprising a range finder, a transmitter, and at least one position sensor, wherein the flying drone is configured to transmit coordinates associated with an initial position of the flying drone; and
 a control unit in communication with the drone and an external network, the control unit comprising a central processing unit, a first database comprising data obtained by assisted three-dimensional modeling of the body, and a second database comprising the coordinates of a plurality of clouds of points, called inspection zones, where each inspection zone represents a portion of the external surface of the body; the control unit furthermore comprising a man-machine interface, a display device, a camera and satellite positioning means, and wherein the control unit is configured to:
 model the body, in the first database, to obtain a virtual model of said body in a virtual system of reference axes;
 model in the second database, of the plurality of clouds of points in the virtual system of reference axes;
 receive a selection of an inspection zone via the man-machine interface;
 transfer the coordinates of each point of the first and second databases from the virtual system of reference axes to a geographic system of reference axes;
 receive the coordinates associated with the initial position of the flying drone;
 calculate a flight plan of the drone for scanning, via the range finder, the selected inspection zone;
 create a 3D meshing of the selected inspection zone scanned by the range finder; and,
 detect the impacts by comparing the 3D meshing and the virtual model of said aircraft and calculate the coordinates of each impact in the geographic system of reference axes and the virtual system of reference axes.

10. The system for locating impacts as claimed in claim 9, wherein the range finder is chosen from among the following range finders: acoustic range finder, radar range finder optical range finder.

11. The system for locating impacts as claimed in claim 9, wherein the drone comprises an accelerometer.

* * * * *